(12) United States Patent
Lin et al.

(10) Patent No.: US 11,610,875 B2
(45) Date of Patent: Mar. 21, 2023

(54) LIGHT EMITTING ARRAY STRUCTURE AND DISPLAY

(71) Applicant: Lextar Electronics Corporation, Hsinchu (TW)

(72) Inventors: Chih-Hao Lin, Hsinchu (TW); Jian-Chin Liang, Hsinchu (TW); Chien-Nan Yeh, Hsinchu (TW); Shih-Lun Lai, Hsinchu (TW); Jo-Hsiang Chen, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 17/100,933

(22) Filed: Nov. 22, 2020

(65) Prior Publication Data

US 2022/0093577 A1    Mar. 24, 2022

(30) Foreign Application Priority Data

Sep. 18, 2020   (TW) ................... 109132460

(51) Int. Cl.
| | |
|---|---|
| *H01L 29/205* | (2006.01) |
| *H01L 33/00* | (2010.01) |
| *H01L 25/16* | (2023.01) |
| *H01L 33/62* | (2010.01) |
| *H01L 33/60* | (2010.01) |

(52) U.S. Cl.
CPC ............ *H01L 25/167* (2013.01); *H01L 33/60* (2013.01); *H01L 33/62* (2013.01)

(58) Field of Classification Search
CPC ........ H01L 25/167; H01L 33/60; H01L 33/62
See application file for complete search history.

(56) References Cited

U.S. PATENT DOCUMENTS

| | | | |
|---|---|---|---|
| 2016/0148578 A1 | 5/2016 | Kishi | |
| 2017/0017326 A1 | 1/2017 | Wu et al. | |
| 2017/0315659 A1 | 11/2017 | Kuroiwa et al. | |
| (Continued) | | | |

FOREIGN PATENT DOCUMENTS

| | | |
|---|---|---|
| CN | 103594054 A | 2/2014 |
| TW | 200718347 A | 5/2007 |
| (Continued) | | |

*Primary Examiner* — Ismail A Muse
(74) *Attorney, Agent, or Firm* — CKC & Partners Co., LLC

(57) ABSTRACT

Disclosed is a light-emitting array structure having a substrate, a plurality of light-emitting pixel units, a plurality of first signal wires, a plurality of second signal wires, and an encapsulating layer. The light-emitting pixel units are arranged in array on the substrate. Each light-emitting pixel unit includes a driving chip, a first flat layer, a first redistribution layer, a second flat layer, a second redistribution layer, and a light-emitting diode. Each first signal wire is electrically connected to a corresponding one of the first redistribution layers and extends in a first direction. The second signal wires extend in a level different from the first signal wires. Each second signal wire is electrically connected to a corresponding one of the second redistribution layers and extends in a second direction different from the first direction. The encapsulating layer covers the light-emitting pixel units, the first and second signal wires, and the substrate.

9 Claims, 5 Drawing Sheets

(56) References Cited

U.S. PATENT DOCUMENTS

| | | | |
|---|---|---|---|
| 2017/0330509 A1 | 11/2017 | Cok et al. | |
| 2018/0137804 A1 | 5/2018 | Choi et al. | |
| 2018/0181244 A1 | 6/2018 | Sato et al. | |
| 2018/0190180 A1 | 7/2018 | Shang et al. | |
| 2018/0197471 A1 | 7/2018 | Rotzoll et al. | |
| 2018/0261149 A1 | 9/2018 | Lin | |
| 2019/0371229 A1 | 12/2019 | Wang et al. | |
| 2020/0118989 A1* | 4/2020 | Wang | H01L 24/81 |

FOREIGN PATENT DOCUMENTS

| | | |
|---|---|---|
| TW | 200834876 A | 8/2008 |
| TW | 201515177 A | 4/2015 |
| TW | 201833890 A | 9/2018 |
| TW | 202015261 A | 4/2020 |

\* cited by examiner

LIGHT EMITTING ARRAY STRUCTURE AND DISPLAY

CROSS-REFERENCE TO RELATED APPLICATION

This application claims priority to Taiwan Application Serial Number 109132460, filed Sep. 18, 2020, which is herein incorporated by reference.

BACKGROUND

Field of Invention

The present disclosure relates to a light-emitting array structure and a display.

Description of Related Art

The mass transfer of micro-LEDs and micro-ICs and electrically connecting them via a redistribution layer (RDL) covering thereon to form a display pixel array are processes well known in the art. However, the structure has the disadvantage of being difficult to be repaired. For example, if there is a need to replace a defected micro-LED or micro-IC, the defected micro-LED or micro-IC cannot be removed as the RDL is disposed thereon. In the case where a new micro-LED or micro-IC is installed after destroying the RDL, the destroyed RDL has to be recovered afterwards. However, it is difficult to apply the method on the RDL manufactured by using the photolithography technique, and the cost is tremendously high.

Moreover, it is difficult to perform binning based on the characteristics of micro-LEDs beforehand when the mass transfer technique is used for bonding micro-LEDs. As a result, the formed pixel array is likely to have an uneven color or uneven brightness.

SUMMARY

In view of this, one goal of the present disclosure is to provide a light-emitting array structure capable of addressing the aforementioned issues.

To achieve the goal, one aspect of the present disclosure is to provide a light-emitting array structure comprising a substrate, a plurality of light-emitting pixel units, a plurality of first signal wires, a plurality of second signal wires, and an encapsulating layer. The light-emitting pixel units are arranged in array on the substrate. Each of the light-emitting pixel units comprises a driver chip, a first flat layer, a first redistribution layer, a second flat layer, a second redistribution layer, and a light-emitting diode. The driver chip is disposed on the substrate. The first flat layer is disposed on the substrate and covers the driver chip. The first redistribution layer is disposed on the first flat layer and electrically connected to the driver chip. The second flat layer is disposed on the first flat layer and covers the first redistribution layer. The second redistribution layer is disposed on the second flat layer and electrically connected to the first redistribution layer. The light-emitting diode is flip-chip bonded to and in contact with the second redistribution layer. Each of the first signal wires is electrically connected to a corresponding one of the first redistribution layers and extends in a first direction. The second signal wires extend in a level different from the first signal wires. Each of the second signal wires is electrically connected to a corresponding one of the second redistribution layers and extends in a second direction different from the first direction. The encapsulating layer covers the light-emitting pixel units, the first signal wires, the second signal wires, and the substrate.

According to one embodiment of the present disclosure, the first signal wires and the first redistribution layers are located at the same level.

According to one embodiment of the present disclosure, the second signal wires and the second redistribution layers are located at the same level.

According to one embodiment of the present disclosure, the first direction is substantially perpendicular to the second direction.

According to one embodiment of the present disclosure, the light-emitting array structure further comprises a reflective layer disposed on a top surface of each of the second flat layers.

According to one embodiment of the present disclosure, the reflective layer comprises a silver reflector, an aluminum reflector, or a distributed Bragg reflector.

According to one embodiment of the present disclosure, each of the second redistribution layers has an upper surface, and the upper surface is a blackened surface.

According to one embodiment of the present disclosure, each of the first signal wires has an upper surface, and the upper surface is a blackened surface.

According to one embodiment of the present disclosure, each of the second signal wires has an upper surface, and the upper surface is a blackened surface.

Another aspect of the present disclosure is to provide a display comprising a driver substrate and a plurality of the aforementioned light-emitting array structures. The light-emitting array structures are disposed on the driver substrate.

BRIEF DESCRIPTION OF THE DRAWINGS

The disclosure can be more fully understood by reading the following detailed description of the embodiment, with reference made to the accompanying drawings as follows.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. The embodiments disclosed below may be combined or substituted with each other under beneficial circumstances, and other embodiments may also be added to an embodiment without further description.

In the following description, certain specific details are set forth in order to provide a thorough understanding of various embodiments of the disclosure. However, one skilled in the art will understand that the disclosure may be practiced without these specific details. Furthermore, for simplifying the drawings, some of the conventional structures and elements are shown with schematic illustrations.

Figure 1:
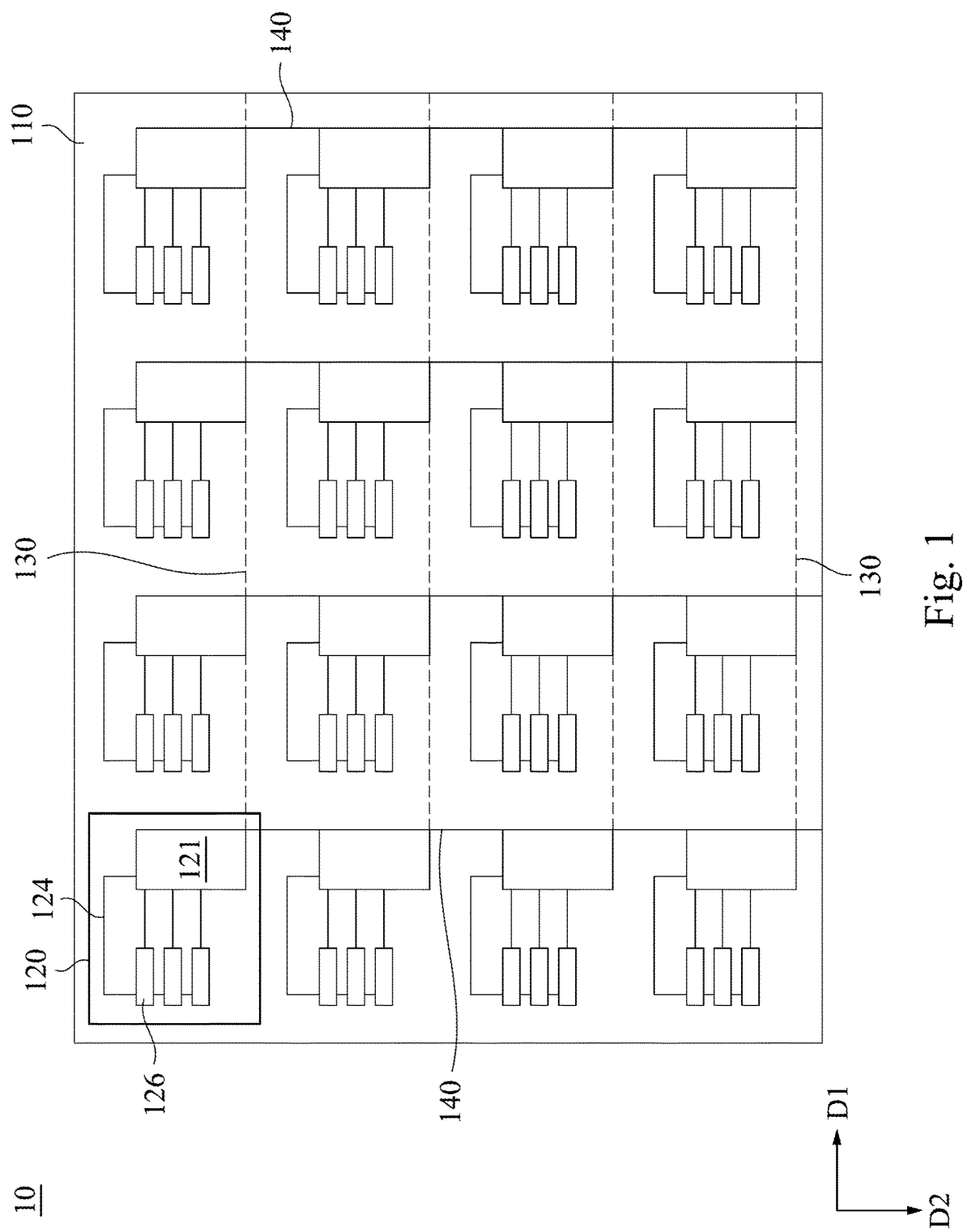
FIG. 1 illustrates a schematic top view of a light-emitting array structure according to one embodiment of the present disclosure.
Figure 2:
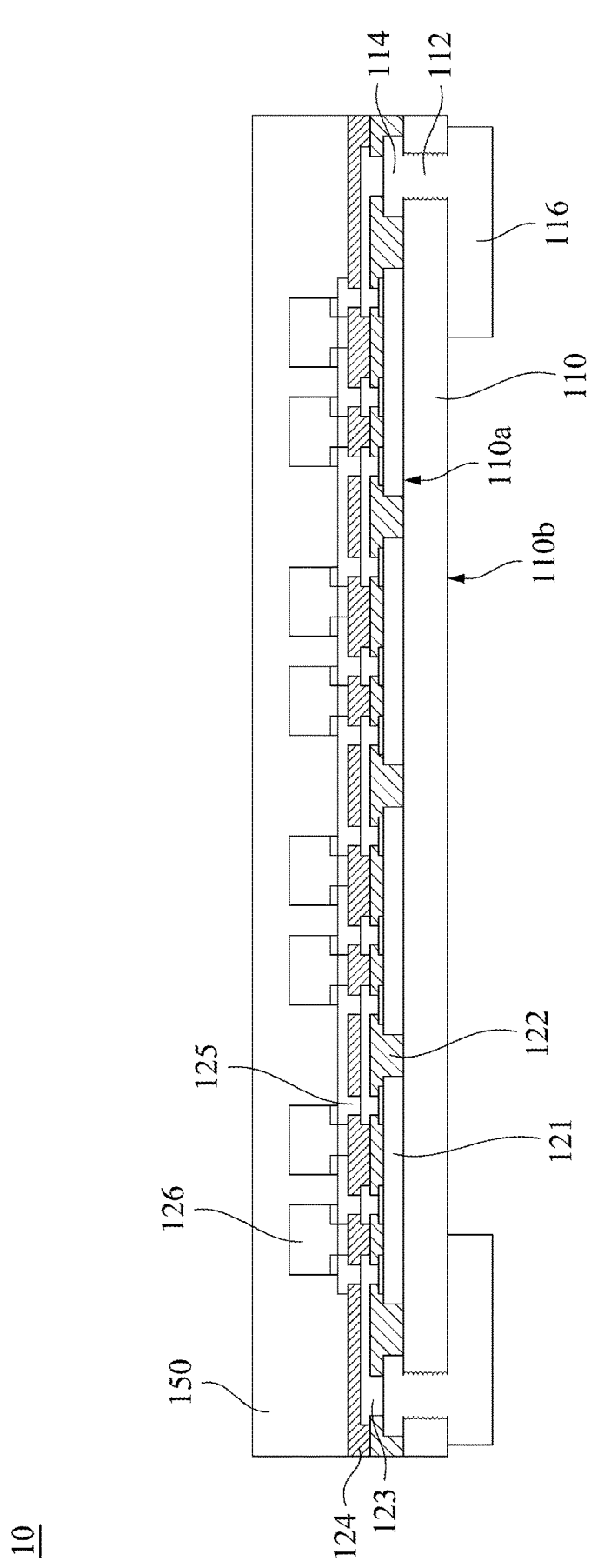
FIG. 2 illustrates a schematic side view of the light-emitting array structure according to one embodiment of the present disclosure.

FIG. 1 illustrates a schematic top view of a light-emitting array structure 10 according to one embodiment of the present disclosure. FIG. 2 illustrates a schematic side view of the light-emitting array structure according to one embodiment of the present disclosure. Reference is made to FIG. 1 and FIG. 2. The light-emitting array structure 10 includes a substrate 110, a plurality of light-emitting pixel units 120, a plurality of first signal wires 130, a plurality of second signal wires 140, and an encapsulating layer 150. In various examples, the substrate 110 may be an aluminum substrate with a high thermal conductivity coefficient, a flexible substrate, a glass substrate, a metal composite laminate, a ceramic substrate, or a semiconductor substrate with functional components such as transistors or integrated circuits (ICs).

In various examples, the substrate 110 further includes a conductive via 112, a first conductive pad 114, and a second conductive pad 116. Specifically, the conductive via 112 penetrates the substrate 110 from an upper surface 110a to a lower surface 110b. The first conductive pad 114 and the second conductive pad 116 are disposed over the upper surface 110a and the lower surface 110b of the substrate 110 respectively and in contact with the conductive via 112. In some examples, the conductive via 112 is made of copper or other conductive materials, such as silver, nickel, tin, aluminum, or the like, but is not limited thereto. In some examples, a through-hole penetrating the substrate 110 from the upper surface 110a to the lower surface 110b may be first formed by using laser drilling, chemical drilling, mechanical drilling or other suitable methods. Next, the through-hole is filled with a conductive material to form the conductive via 112. In some examples, the first conductive pad 114 and the second conductive pad 116 are made of copper or other conductive materials, such as gold, silver, palladium, nickel, tin, aluminum, or the like, but is not limited thereto.

Reference is still made to FIG. 1 and FIG. 2. A plurality of light-emitting pixel units 120 are arranged in array on the substrate 110. Specifically, each of the light-emitting pixel units 120 includes a driver chip 121, a first flat layer 122, a first redistribution layer 123, a second flat layer 124, a second redistribution layer 125 and a light-emitting diode 126. More specifically, the driver chip 121 is disposed on the substrate 110.

In various examples, the driver chip 121 in the present disclosure may be such as a mini-driver chip with a size ranging from about 1 μm to 300 μm. Specifically, the size of the mini-driver chip may be such as 10 μm, 30 μm, 50 μm, 70 μm, 100 μm, 120 μm, 150 μm, 200 μm, or 250 μm. It is understood that power supply pins of the driver chip 121 may be connected to an output end of a power supply circuit to receive the power supply, while driving pins of the driver chip 121 may be connected to the light-emitting diode 126 to control the operation of the circuit of the light-emitting diode. In various examples, the driver chip 121 has an over-temperature protection (OTP) function. For example, when the internal temperature of the driver chip 121 exceeds a predetermined temperature (for example, 100° C.), a protection function, such as turning off the driver chip 121 to stop receiving the power supply, is activated.

Reference is still made to FIG. 1 and FIG. 2. More specifically, the first flat layer 122 is disposed on the substrate 110 and covers the driver chip 121. In various examples, the first flat layer 122 may comprise an oxide layer or a photosensitive insulating material, such as a photoresist material containing epoxy. In various examples, the first flat layer 122 may be formed by using coating, spray-coating, printing or other suitable methods.

Reference is still made to FIG. 1 and FIG. 2. More specifically, the first redistribution layer 123 is disposed on the first flat layer 122 and electrically connected to the driver chip 121. In some examples, the first redistribution layer 123 comprises copper, nickel, gold, aluminum, silver or other suitable metals. In some other examples, the first redistribution layer 123 may comprise aluminum-copper alloy, aluminum-silicon-copper alloy, or other alloys. In some examples, the first redistribution layer 123 may be formed on the first flat layer 122 by using a deposition process such as sputtering, evaporating, electroplating or other suitable deposition processes, followed by a performing photolithography process and an etching process. In another example, a roughening process may be performed on the surface of the first flat layer 122, such that an excellent binding force is provided between the first redistribution layer 123 and the first flat layer 122.

Reference is still made to FIG. 1 and FIG. 2. More specifically, the second flat layer 124 is disposed on the first flat layer 122 and covers the first redistribution layer 123. In various examples, the material and the manufacturing method of the second flat layer 124 may be the same or similar to those of the first flat layer 122 and therefore are not repeated herein.

Reference is still made to FIG. 1 and FIG. 2. More specifically, the second redistribution layer 125 is disposed on the second flat layer 124 and electrically connected to the first redistribution layer 123. In various examples, the material and the manufacturing method of the second redistribution layer 125 may be the same or similar to those of the first redistribution layer 123 and therefore are not repeated herein. In various examples, an upper surface of the second redistribution layer 125 is a blackened surface. In this design, the proportion of the blackened area in the light-emitting array structure 10 is increased to prevent users from seeing.

Reference is still made to FIG. 1 and FIG. 2. More specifically, the light-emitting diode 126 is flip-chip bonded to and in contact with the second redistribution layer 125. In this design, the light-emitting diode 126 is not covered by any wires, and therefore the light emission efficiency thereof is not affected. In various examples, the light-emitting diode 126 may be a red light-emitting diode, a green light-emitting diode, a blue light-emitting diode, a yellow light-emitting diode, a white light-emitting diode, and combinations thereof. In some examples, the light-emitting diode 126 may be a mini-LED or a micro-LED. Although each of the light-emitting pixel units 120 in FIG. 1 merely includes three light-emitting diodes 126, the number of the light-emitting diode 126 can be increased to, for example, four, five, six, seven, or above, depending on design requirements.

Since the light-emitting diode 126 and the driver chip 121 are located at different levels in the design of the light-emitting pixel units 120 in the present disclosure, the position of the light-emitting diode 126 is not limited by the position of the driver chip 121 and vice versa. In various examples, the light-emitting diode 126 has a vertical projection overlaps with a vertical projection of the driver chip 121. In this design, the light-emitting diode 126 can be arranged at the center without affecting the light emission symmetry of the light-emitting pixel units 120, such that an improved optical effect is achieved. In another example, depending on design requirements on light emission, the vertical projection of the light-emitting diode 126 may not overlap with the vertical projection of the driver chip 121.

Reference is still made to FIG. 1 and FIG. 2. Each of the first signal wires 130 is electrically connected to a corresponding one of the first redistribution layers 123 and extends in a first direction D1. In various examples, the first signal wires 130 may comprise aluminum-copper alloy, aluminum-silicon-copper alloy, or other alloys. In some examples, the first signal wires 130 may be formed on the first flat layer 122 by using a deposition process such as sputtering, evaporating, electroplating or other suitable deposition processes, followed by performing a photolithography process and an etching processes. Therefore, it is understood that the first signal wires 130 and the first redistribution layer 123 are on the same level. In various examples, an upper surface of each of the first signal wires 130 is a blackened surface. In this design, the proportion of the blackened area in the light-emitting array structure 10 is increased to prevent users from seeing.

Reference is still made to FIG. 1 and FIG. 2. A plurality of second signal wires 140 extend in a level different from the first signal wires 130. More specifically, each of the second signal wires 140 is electrically connected to a corresponding one of the second redistribution layers 125 and extends in a second direction D1 different from the first direction D1. In various examples, the second signal wires 140 may comprise aluminum-copper alloy, aluminum-silicon-copper alloy, or other alloys. In some examples, the second signal wires 140 may be formed on the second flat layer 124 by using a deposition process such as sputtering, evaporating, electroplating or other suitable deposition processes, followed by performing a photolithography process and an etching processes. Therefore, it is understood that the second signal wires 140 and the second redistribution layer 125 are at the same level in various examples. In various examples, the first direction D1 is substantially perpendicular to the second direction D2. In various examples, an upper surface of each of the second signal wires 140 is a blackened surface. In this design, the proportion of the blackened area in the light-emitting array structure 10 is increased to prevent users from seeing.

Reference is still made to FIG. 1 and FIG. 2. The light-emitting pixel units 120, the first signal wires 130, the second signal wires 140 and the substrate 110 are covered by the encapsulating layer 150. In various examples, the encapsulating layer 150 may comprise an organic packaging material, an inorganic packaging material or combinations thereof. For example, the organic packaging material comprises silicon rubber, acrylic and epoxy resin, while the inorganic packaging material comprises silicon dioxide and fluorine adhesive. However, the present disclosure is not limited thereto. In some embodiments, the encapsulating layer 150 may be formed by dispensing, molding, glue-filling or other suitable processes. The encapsulating layer 150 can increase the area capable to block moisture and protect the light-emitting array structure 10 from moisture, thereby increasing the reliability and service life of the product.

In some examples, an additive (not shown) may further be added to the encapsulating layer 150 to conceal wires and increase the brightness of light-emitting elements. For example, the additive may be organic particles or inorganic particles, such as ceramic particles, metal particles, glass particles and polymer particles, and the like.

Figure 3:
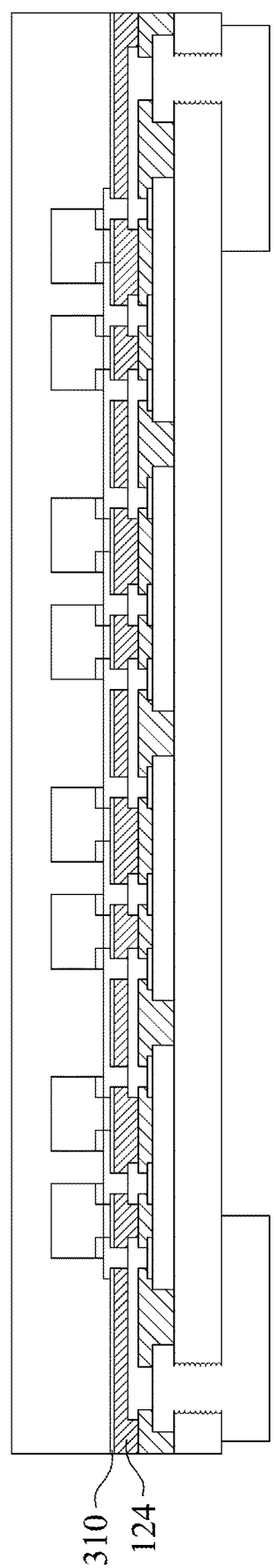
FIG. 3 illustrates a schematic side view of a light-emitting array structure according to another embodiment of the present disclosure.

FIG. 3 illustrates a schematic side view of a light-emitting array structure 30 according to another embodiment of the present disclosure. In order to facilitate the comparison with the aforementioned embodiments and simplify the description, the same reference numbers are used in the following embodiments to refer to the same or like parts. Also, the differences between embodiments are discussed below and similar parts will not be repeated.

The light-emitting array structure 30 is different from the light-emitting array structure 10 as the light-emitting array structure 30 further comprises a reflective layer 310 disposed on a top surface of the second flat layer 124. In various examples, the reflective layer 310 may be a silver reflector, an aluminum reflector or a distributed Bragg reflector (DBR). Specifically, the distributed Bragg reflector may be composed of two or more thin films stacked alternatively, in which the thin films are homogenous or heterogeneous materials with different refractive indices. For example, the distributed Bragg reflector may be composed of alternatively stacked $SiO_2$ and $TiO_2$ thin films or alternatively stacked $SiO_2/Al_2O_3/TiO_2$ thin films. This design can increase the light emission efficiency of the light-emitting array structure 30.

Figure 4:
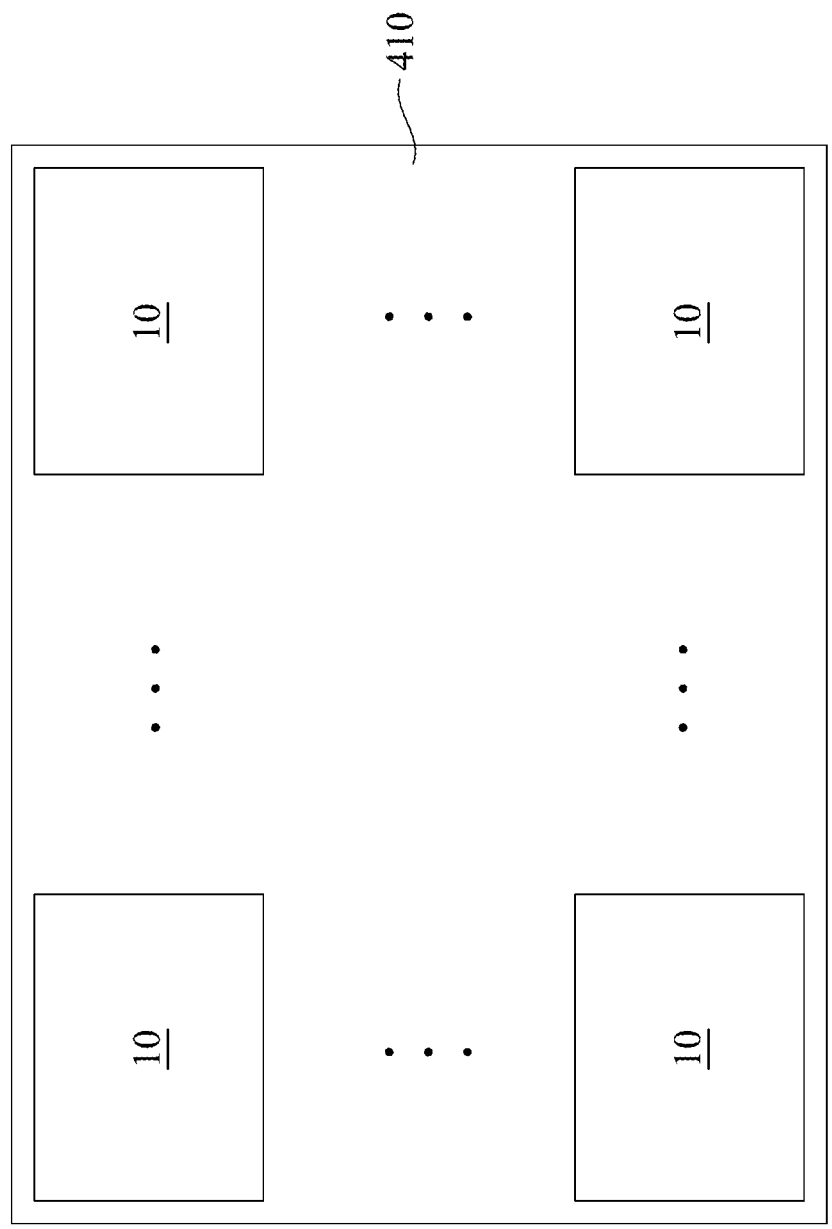
FIG. 4 illustrates a schematic top view of a display according to one embodiment of the present disclosure.

FIG. 4 illustrates a schematic top view of a display 40 according to one embodiment of the present disclosure. As shown in FIG. 4, the display 40 comprises a driver substrate 410 and the light-emitting array structure 10 or 30 as described above. The light-emitting array structure 10 or 30 is disposed on the driver substrate 410. In various examples, the driver substrate 410 may be such as a light board, a light-emitting diode array substrate, or a circuit board. As one or more of the light-emitting pixel units 120 are defective, the light-emitting array structure 10 or 30 can be replaced entirely, thereby simplifying the repair process.

Figure 5:
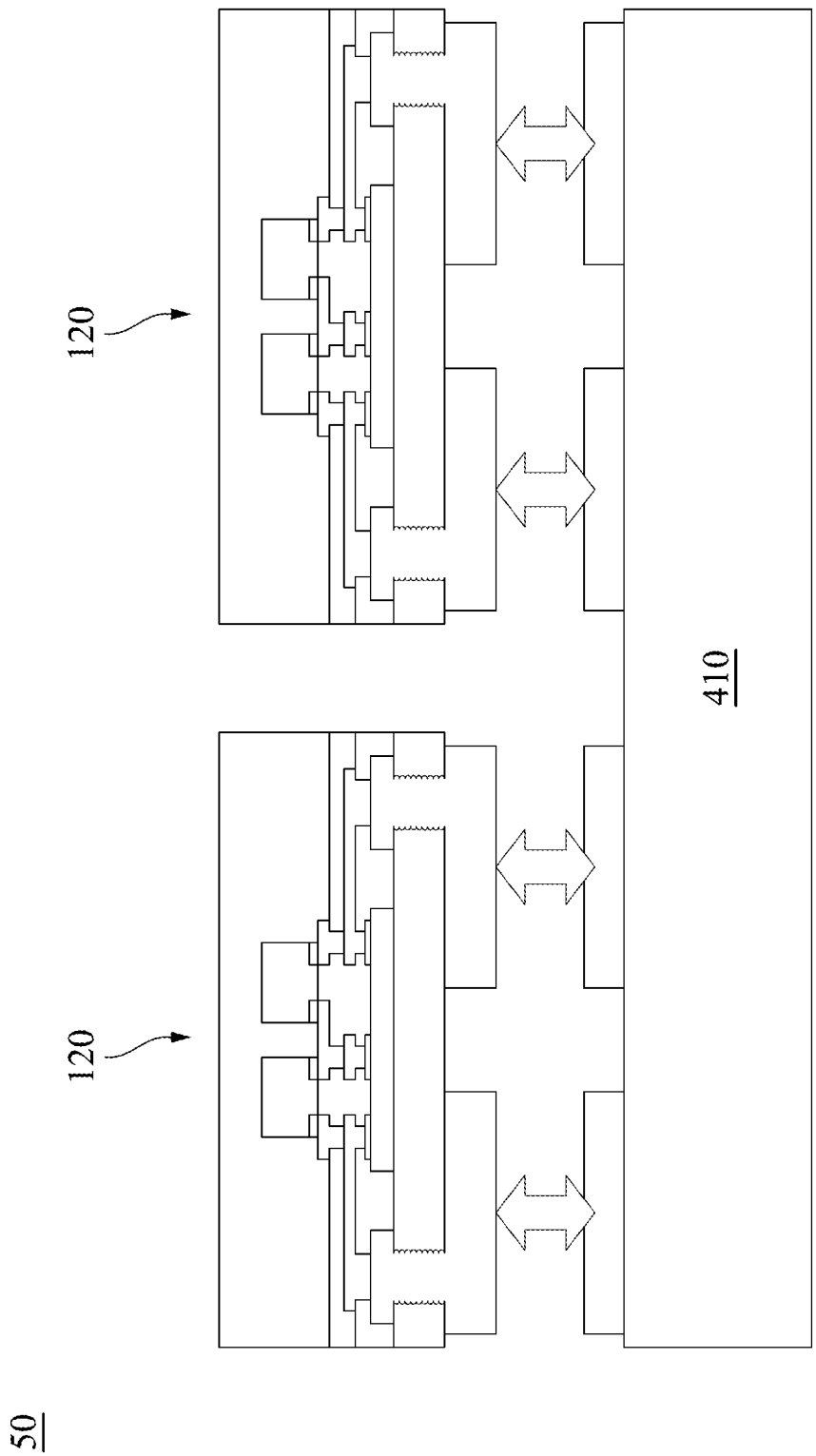
FIG. 5 illustrates a schematic view of a display package according to another embodiment of the present disclosure.

FIG. 5 illustrates a schematic view of a display package 50 according to another embodiment of the present disclosure. As shown in FIG. 5, the light-emitting array structure 10 shown in FIG. 1 may be diced to form a plurality of individual light-emitting pixel units 120. The individual light-emitting pixel units 120 are subjected to binning based on their characteristics and are then bonded to the driver substrate 410. As one of the light-emitting pixel units 120 is defective, the defective light-emitting pixel units 120 are easy to be removed and directly replaced. The approach not only advantages in simplifying the repair process, but also reduces time, material and cost for failure analysis and repair work. Furthermore, by means of binning the individual light-emitting pixel unit 120 and then bonding the light-emitting pixel units 120 with the same specifications to one driver substrate 410, the unevenness in visual appearance can be eliminated. Compared with the display package 50 shown in FIG. 5, the cost of package dicing, binning, surface mounting and repair of the display 40 shown in FIG. 4 can be further reduced.

In summary, in the light-emitting array structure of the present disclosure, a plurality of flat layers are used to alleviate the level difference in the conventional redistribution layer, such that each of the redistribution layers can be flatly disposed on the flat layer and is therefore capable to maintain narrow, thin circuits with high precision. Moreover, while manufacturing the redistribution layer, signal wires arranged in array of the display can be manufactured at the same time to achieve the advantage of circuit integration. Furthermore, the redistribution layer has a surface flatness higher than a surface flatness of the substrate, such that the transfer yield for the mass transfer technique is improved. In the design in the present disclosure, a substrate with high-precision circuits is not necessary, and the light-emitting array structure can be easily miniaturized. In addition, the display of the present disclosure is easy to repair.

Although the present disclosure has been described in considerable detail with reference to certain embodiments thereof, other embodiments are possible. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light-emitting array structure, comprising:
   a substrate;
   a plurality of light-emitting pixel units arranged in array on the substrate, each of the light-emitting pixel units comprising:
      a driver chip disposed on the substrate;
      a first flat layer disposed on the substrate and covers the driver chip;
      a layer of a plurality of first redistribution layers disposed on the first flat layer and electrically connected to the driver chip;
      a second flat layer disposed on the first flat layer and covers the first redistribution layers;
      a layer of a plurality of second redistribution layers disposed on the second flat layer and electrically connected to the layer of the plurality of first redistribution layers; and
      a light-emitting diode, flip-chip bonded to and in contact with the second redistribution layers;
   a plurality of first signal wires, wherein each of the first signal wires is electrically connected to a corresponding one of the first redistribution layers and extends in a first direction;
   a plurality of second signal wires extending in a level different from the first signal wires, wherein each of the second signal wires is electrically connected to a corresponding one of the second redistribution layers and extends in a second direction different from the first direction; and
   an encapsulating layer covering the light-emitting pixel units, the first signal wires, the second signal wires, and the substrate;
   wherein each of the second redistribution layers has an upper surface, and the upper surface is a blackened surface.

2. The light-emitting array structure of claim 1, wherein the first signal wires and the first redistribution layers are located at a same level.

3. The light-emitting array structure of claim 1, wherein the second signal wires and the second redistribution layers are located at a same level.

4. The light-emitting array structure of claim 1, wherein the first direction is substantially perpendicular to the second direction.

5. The light-emitting array structure of claim 1, further comprising a reflective layer disposed on a top surface of each of the second flat layers.

6. The light-emitting array structure of claim 5, wherein the reflective layer comprises a silver reflector, an aluminum reflector, or a distributed Bragg reflector.

7. The light-emitting array structure of claim 1, wherein each of the first signal wires has an upper surface, and the upper surface is a blackened surface.

8. The light-emitting array structure of claim 1, wherein each of the second signal wires has an upper surface, and the upper surface is a blackened surface.

9. A display, comprising:
   a driver substrate; and
   a plurality of light-emitting array structures of claim 1 disposed on the driver substrate.

* * * * *